(12) United States Patent
Hsu

(10) Patent No.: US 6,316,843 B1
(45) Date of Patent: Nov. 13, 2001

(54) SHARED CHARGE PUMP VOLTAGE RAMP

(75) Inventor: Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/455,113

(22) Filed: Dec. 6, 1999

(51) Int. Cl.$^7$ ...................................... H02J 1/00

(52) U.S. Cl. ................. 307/29; 307/18; 307/31; 307/38

(58) Field of Search .................. 307/29, 31, 32, 307/37, 38, 109, 110, 18; 365/190, 230.07, 189.11; 327/536

(56) References Cited

U.S. PATENT DOCUMENTS 6,212,109 * 4/2001 Proebstring ..................... 365/190

* cited by examiner

Primary Examiner—Josie Ballato
Assistant Examiner—Robert L. Deberadinis
(74) Attorney, Agent, or Firm—Eric W. Petraske

(57) ABSTRACT

A power management system for integrated circuits having several voltage levels shorts two buses together during a voltage ramp period, so that the charge pumps connected to both buses drive both buses. When the lower bus reaches its design voltage, the shorting switch is opened and a set of pumps drives the higher bus to its design voltage. After the ramp, the voltage controls on the pumps and the current path to a bus are switched as needed in order to supply each bus with the required current capacity.

4 Claims, 4 Drawing Sheets

SHARED CHARGE PUMP VOLTAGE RAMP

FIELD OF THE INVENTION

The field of the invention is integrated circuits, in particular circuits that have on-chip power generation circuits, such as charge pumps.

BACKGROUND OF THE INVENTION

In modern integrated circuits, there is a need for more voltage levels than are supplied on the printed circuit board. For example, a DRAM with a negative wordline scheme will require the wordline voltage (e.g. −0.5V) and also a negative substrate bias (e.g. −0.75V). Positive voltages will include the boosted wordline voltage (e.g. 3.3V), the internal voltage (e.g. 2.5V), the bit-line high voltage (e.g. 2.1V), etc.

Some of the power supply levels will need to handle much more current than others. The high-current levels will ramp up quickly during a power-on period, while the levels that need only low current will have charge pumps with a smaller capacity in order to save power and will take longer to reach their level, even if that level has a smaller absolute value than the high-capacity level.

The lower capacity pumps could be redesigned with increased capacity so that it will improve the ramp-up speed, but that would waste silicon area, and consume more power.

SUMMARY OF THE INVENTION

The invention relates to an on-chip voltage generator system that provides for reduced voltage ramp up time by sharing charge pumps. During an initial period, the distribution bus for the most negative (or most positive) voltage is tied to the next negative (or positive) voltage, so that all the pumps for the two voltages operate on both lines in this period. When the next negative (or positive) voltage is reached, the buses are separated and a selected set of charge pumps continues to ramp up to the most negative (or positive) level.

A feature of the invention is the provision of switchable bus connection circuits. Initially through these switches the buses are tied together through these switches, so that the generators drive all the buses to the next negative (or positive) level. When this level is reached, the switchable bus connection circuits switch off and untie the buses. This approach is especially advantageous when the generator used for driving to the next negative (or positive) level is weak, and by joining the generators, it will speed up the ramp time.

Another feature of the invention is the provision of multiplexer switches that allow a generator to connect to one of two buses. During the power ramp time, the generator is connected to the most negative (or positive) voltage level. When the next negative (or positive) voltage level is reached, the bus connection switch opens and the generator continues to drive the second bus to the most negative (or positive) value. When this level is reached, the multiplexer switches the connection so that the same generator will maintain the first bus at the next negative (or positive) level during normal operation. This approach is advantageous when the original generator designed to drive the bus to the most negative (or positive) level is weak due to a lower current demand. Multiplexing the generator from its normal connection (to the first bus) to drive the second bus to the most negative (or positive) level will speed up the ramp time.

Yet another feature of the invention is the provision of a bus selection circuit that connects a pump to both of selected buses until the lower bus voltage is reached and thereafter only to the higher voltage. When the higher voltage is reached, the pump is reconnected to the lower bus.

DESCRIPTION OF THE PREFERRED EMBODIMENT

Figure 1:
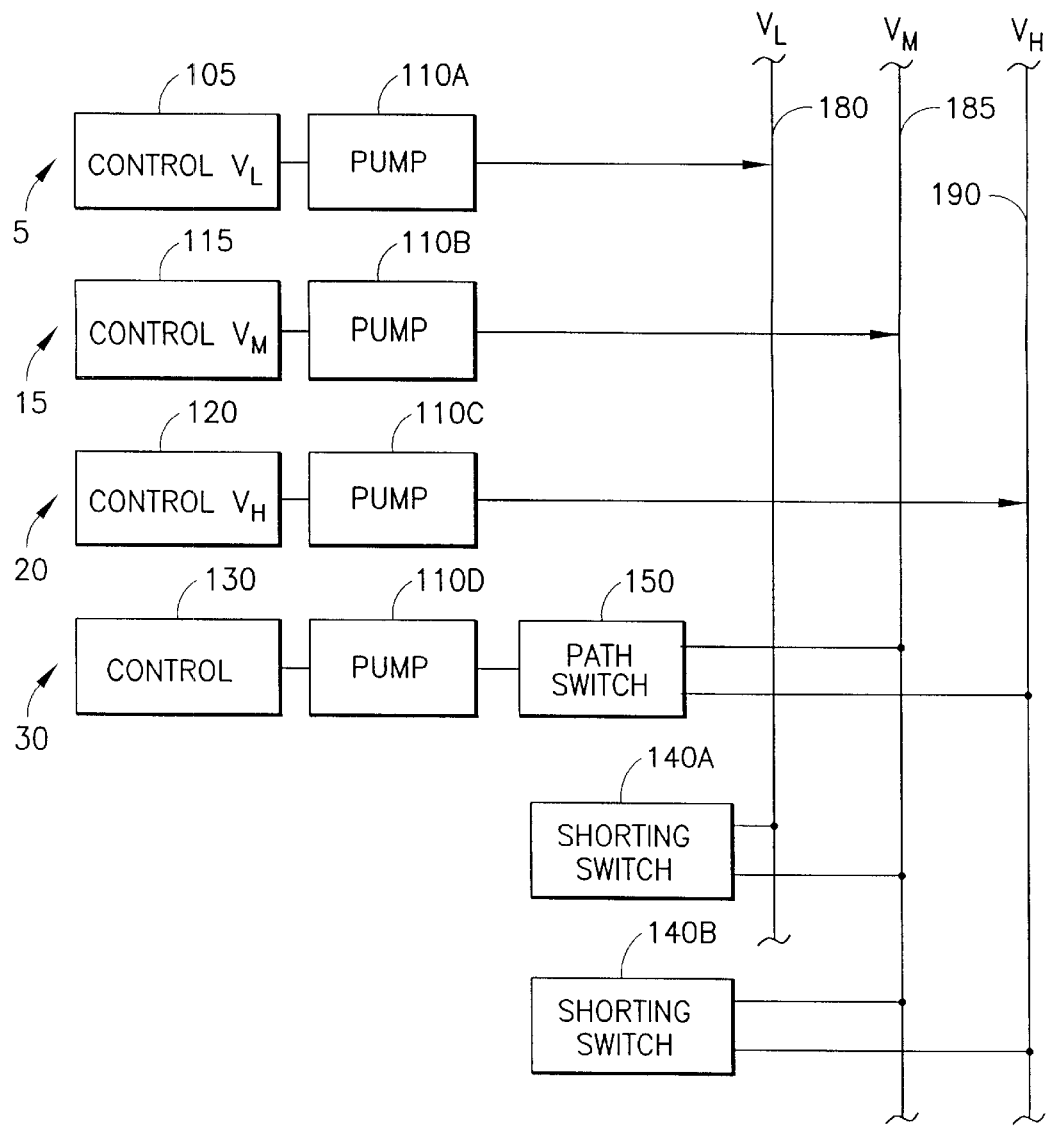
FIG. 1 illustrates in schematic form a DC power generator system according to the invention.

Referring now to FIG. 1, there is shown a block level diagram of a DC generator system according to the invention. At the right of the figure, three voltage distributions lines (buses) 180, 185 and 190 distribute low, medium and high voltages. To improve clarity, the terms low, medium and high will be used here to refer to absolute values. At the top of the figure, there is a conventional arrangement, denoted generally with numeral 5, in which voltage generator circuit (which comprises a charge pump) 110A supplies current to bus 180 under control of controller 105. Controller 105 turns pump 110A on to ramp up to the required voltage and then turns it on and off as required to maintain the voltage. Below supply 5, there is a supply 15 through pump 110B that drives bus 185 to the medium voltage and supply 20 that through pump 110C drives bus 190 to the high voltage. In a preferred embodiment, there will be enough of these "single-bus" supplies connected to each bus to maintain the voltage when the circuit is inactive. The blocks denoted 5, 15 and 20 represent a set of small-capacity charge pumps (or weak pump) or a single high capacity pump (or strong pump). The circuit designer will select one of these alternatives in response to the usual tradeoffs.

At the bottom of the figure, there is a different arrangement, explained below and denoted with the numeral 30, in which controller 130 switches between two values, illustratively $V_M$ and $V_H$ and pump 110 is connected to one of two buses.

For convenience in exposition, the following refers only to a two-bus design including buses 180 and 185. During the initial voltage ramp, lines 180 and 185 are tied together by shorting switch 140A, controlled as illustrated below, so that both pumps 110A and 110B will ramp up both lines until the lower value $V_L$ is reached. When the lower value VL is reached on line 180, the comparator in controller 105 changes state, emitting a signal that opens switch 140A, isolating the lines. At this moment, both the controller 105 and pump 110A are stopped. Controller 115 is set at the value $V_M$ so that pump 110B continues to drive bus 185 to its design value.

Figure 2:
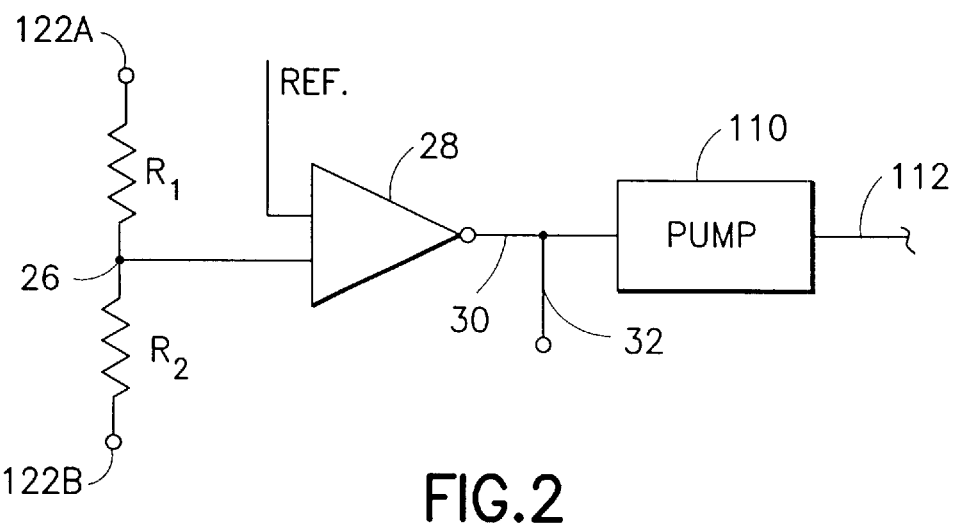
FIG. 2 illustrates in schematic form a single-bus pump controller circuit according to the invention.

Referring now to FIG. 2, there is shown controller 105 in more detail. On the left, a resistor divider consisting of R1 and R2 is connected in such a way that R1 is in between node 122A and node 26, and R2 is in between node 26 and 122B. When the output voltage of the pump is positive, node 122A is connected to the pump output node 112, and 122B is connected to ground. When the voltage is negative, node 122A is connected to internal voltage Vdd, and node 122B is connected to pump output node 112. In that case, node 26 will be pulled down to meet the reference and the inputs to comparator 28 will be switched. Conventional comparator 28 compares the voltage on intermediate node 26 and a reference voltage. The reference voltage may come from any convenient source, such as a band gap reference circuit. When the voltage on node 26 reaches the reference, the output 30 of comparator 28 switches state, turning off pump 110 and passing the signal along node 32 to open switch 140, as described below with respect to FIG. 2. Comparator 28 and pump 110 are conventional circuits which are well known in the art and will not be described further. The above description also applies to supplies 15 and 20, except that their divider chains are adjusted appropriately for the corresponding voltage. Those skilled in the art will readily be able to add resistors and/or tap the resistor chain appropriately in order to accommodate positive and negative buses.

Figure 4:
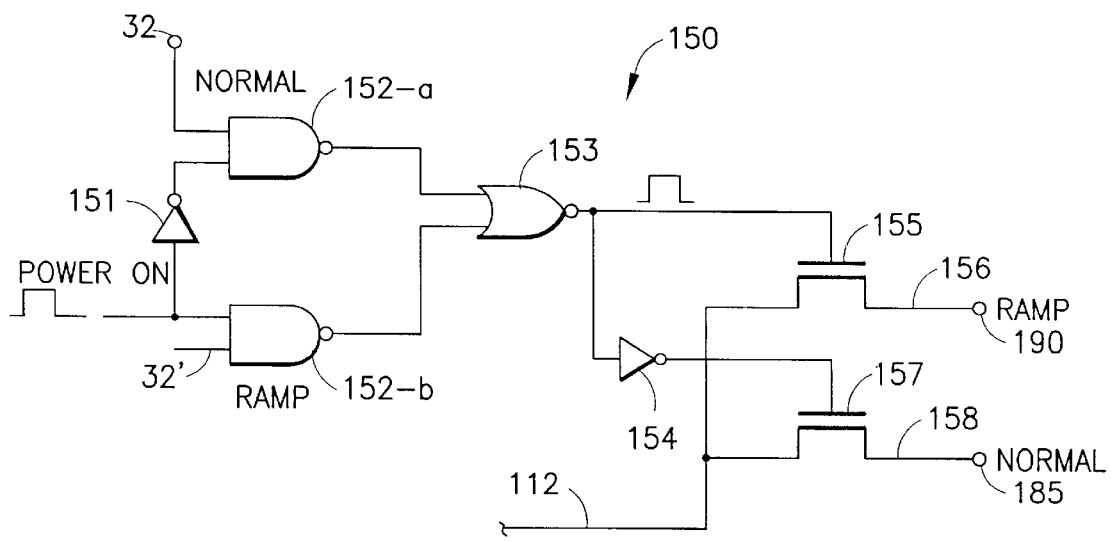
FIG. 4 illustrates in schematic form a bus selection switch for applying pump output to one of two buses.
Figure 5:
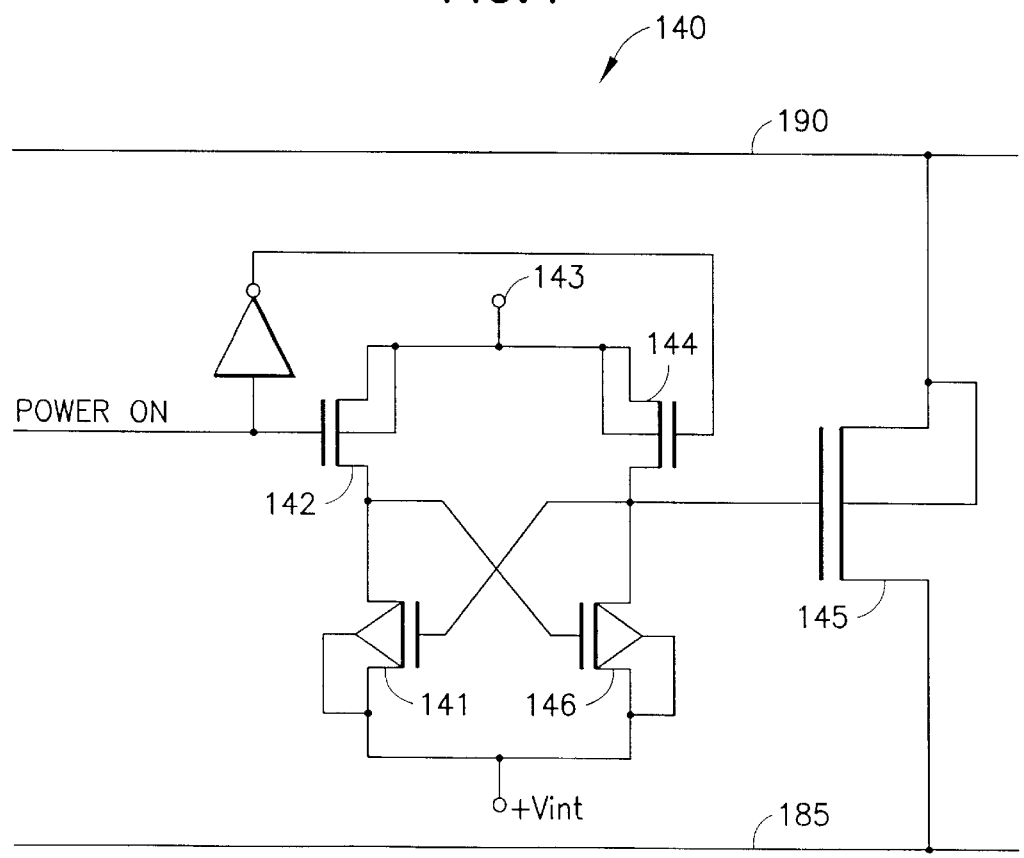
FIG. 5 illustrates in schematic form a bus connection switch for shorting two buses together during the power ramp.
Figure 6:
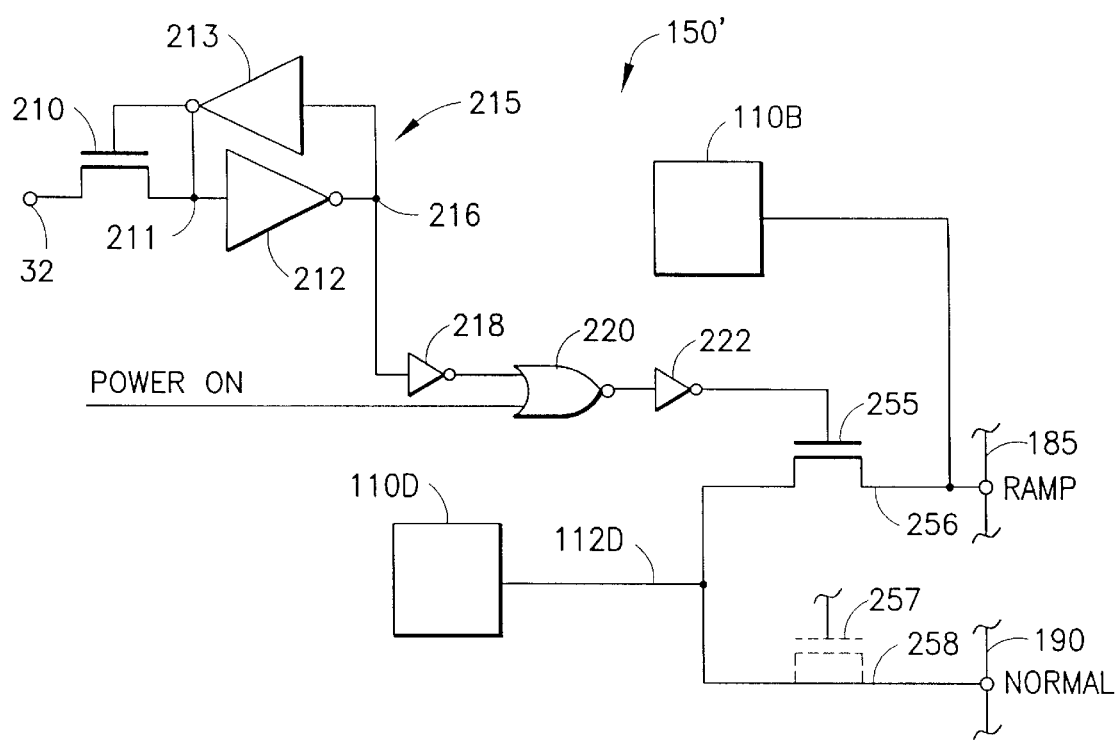
FIG. 6 illustrates in schematic form a bus selection switch that connects one pump to two buses, and associated control circuits.

Referring now to FIG. 5, there is shown an illustrative shorting switch 140. Those skilled in the art will readily be able to devise other suitable switches. The connection transistors in FIGS. 4, 5 and 6 are drawn as Nfets, suitable for use with negative buses. Those skilled in the art will readily be able to make the appropriate changes to use Pfets for positive buses. The Poweron signal entering on the left turns on Nfet 142 and, inverted, turns off Nfet 144. Nfet 142 passes a below threshold voltage from node 143 (a negative wordline or any other convenient source, or ground) to turn on Pfet 146, thus turning on the large-capacity Nfet 145, which shorts the two buses (e.g. 185 and 190). After the ramp, transistor 145 is held off by the application of the low level from node 143 through Nfet 144. This circuit illustrates the need for the Poweron signal. The controllers will be changing state during normal operation of the circuit and it is necessary to render switches 140 inactive during normal operation.

This arrangement is useful when the higher voltage level requires more current and thus has a stronger pump than the lower voltage level. The stronger pump of the upper level is "borrowed" to drive up the lower line much more quickly than the weaker pumps necessary for maintaining is the current supply at that voltage could manage.

The same principle can be applied to a configuration of more than two buses. Each bus will have enough single-bus supplies to maintain its voltage when the system is quiescent and pumps additional to that number will be connected to both the bus used in normal operation and, through a shorting switch 140, to another bus that needs additional capacity during ramp up. In the case where a lower voltage level requires the higher current during operation, the designer is faced with the prospect of letting the final ramp to the higher voltage proceed more slowly with a limited number of pumps having controllers set at that higher level and connected to the higher bus. For convenience, the term "higher bus" will be used as a reference to a bus having a higher voltage level; and similarly for "lower bus".

Supply 30 is an alternative embodiment that applies when the lower voltage of two levels requires the greater amount of current. In other words, pump 110D is stronger than pump 110C (Supply 15 will not necessarily be used in this embodiment). In this arrangement, controller 130 is designed to operate at both the higher and the lower levels, as described below with respect to FIG. 3. Initially, the controller is set at the lower voltage level and the pump 110D is connected to bus 190 through power multiplexer switch 150, described with respect to FIG. 4, during the voltage ramp. The circuits in FIGS. 4, 5 and 6 will be referred to generically as power connection circuits. Until the Vm level is reached, the shorting switch 140B passes current from the higher bus to the lower bus, driving it up along with the higher bus. When the voltage levels of bus 185 and 190 both reach Vm, the two buses are separated by opening switch 140B.

The control signal to open switch 140B may be generated in a number of ways. If the architecture of the chip is such that a number of small charge pumps are used to supply bus 185, then one of them could be tied to bus 185 (supply 15 in FIG. 1). In that case, the signal to open switch 140B would come from controller 115 and controller 130 would be set initially at $V_H$, reverting to $V_M$ at the end of the is ramp. If the architecture of the chip is such that only one pump (110D) is used for bus 185, then controller 130 would be initially set at $V_M$. When bus 185 reaches its design level, controller 130 changes state. That signal passes from node 32 of controller 130 to switch 140B, opening it, and also changes the resistor chain in FIG. 3, so that transistor 25 is off and supply 30 then drives bus 190 to its design level. Controller 130 then changes state for the second time and turns transistor 25 on. Controller 130 will thereafter maintain bus 185 at its design level. At this time, multiplex switch 150 is changed in response to the signal from node 32 of controller 120, so that pump 110D is now connected to bus 185 and controlled to maintain $V_M$. Thus, the high current capacity is available for both buses regardless of which bus has the greater current capacity in normal operation. Note that such switching and multiplexing activities occur only during the ramp up period. When chip power-on is finished, each pump will only supply current to its own bus.

Figure 3:
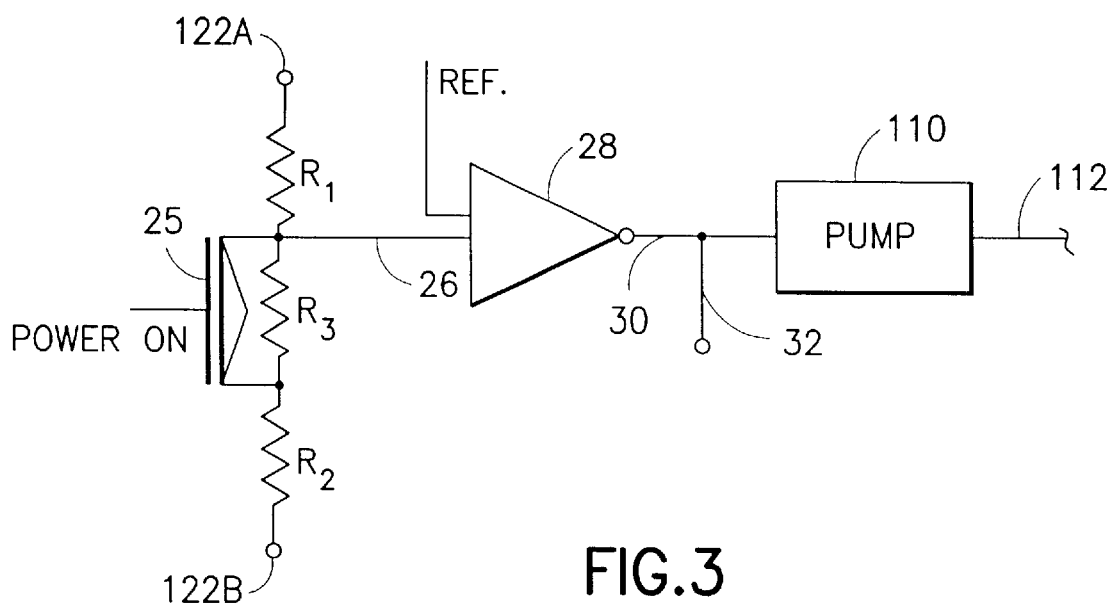
FIG. 3 illustrates in schematic form an alternative pump controller circuit for selectively controlling the pump to one of two voltage levels.

In the case such as supply 30, in which the output of the pump is directed at a higher bus during ramp. And then switched to a lower bus during normal operation, a modified controller is used as shown in FIG. 3. There, a three-resistor divider chain is set so that the voltage on node 26 is correct for the higher voltage ($V_H$, say) being controlled during the ramp and, during normal operation, the voltage on node 26 is correct for the lower voltage ($V_M$, say). An illustrative mechanism for this shift is the use of a Pfet 25 that is turned off during the ramp when the Poweron signal is high and is turned on during normal operation when the Poweron signal is low. The Poweron signal is illustratively high until the last bus has reached its design value. Those skilled in the art will readily be able to devise alternative mechanisms for this shift, such as the use of an inverse Poweron signal with an Nfet, two comparators with simple logic passing one control signal during the ramp and the other signal during normal operation or any number of alternatives. Likewise, the Poweron signal may be high for a fixed time; or it may respond to the highest level and then be latched.

Referring now to FIG. 4, there is shown power multiplexer switch 150, which directs the current from pump 110D to one or another bus. At the upper left of the Figure, two NAND gates 152-a and 152-b pass signals to control current flow during normal operation and during the ramp, respectively. These circuits respond to the "Poweron" signal that enables the ramp-up mode of the supply circuits, to a signal on node 32' from controller the controller that controls current flow during the power on ramp and to a signal on node 32 from the controller that controls the charging during normal operation. In the case illustrated, bus 185 requires the higher current in normal operation, so that node 32' is in controller 120 and node 32 is in controller 130. During the ramp, the output from NAND 152-*b* passes through NOR circuit 153 to turn on ramp transistor 155 and establish a path between pump 110D (coming in on line 112) and the higher bus (e.g. 190) being driven during the ramp. After the end of the power up signal, NAND 152-*a* passes the signal from the normal controller to open a path through transistor 157 to maintain the other bus (e.g. 185) at its specified voltage level. If switch 150 is connected to buses 180 and 185, then transistor 155 will be connected to bus 185 and transistor 157 to bus 180.

In an alternative embodiment, in which two of three buses handle a similar amount of current (180 and 185, say) and the other (190) significantly less, a second supply corresponding to supply 30 may be set up to drive buses 180 and 190. The pumps in both supplies would be connected to bus 190 during ramp. During normal operation the pumps in one supply would feed bus 180 and the pumps in the other supply would feed bus 185. Bus 190 would be driven by a single-bus supply 20.

Another alternative embodiment eliminates the need for shorting switch 140B. Referring now to FIG. 6, there is shown circuit 150' for the case when bus 185 requires lower current during normal operation. A modified switch 150' connects both pumps 110B and 110D (the stronger pump) to both buses 185 and 190 during the ramp period, with the path through switch 150' being disconnected from bus 185 after it reaches its design voltage and during normal operation. Pump 110D is connected directly to bus 190 through node 258 and to bus 185 through connection transistor 255, having its output connected to node 256 (to which the output of pump 110B is also connected). Optional pass transistor 257 is described below. During a first ramp period, transistor 255 is turned on by the elements in the upper left of the Figure and both pumps drive both buses. During a second ramp period, the higher capacity pump 110D drives bus 190. In the control logic, transistor 210 is turned on during the initial period until bus 185 reaches the $V_M$ voltage level and permits the signal from node 32 to pass through. Latch 215 is configured as is known in the art so that input node 211 is high when the power is first turned on. Alternatively, an initial signal can be applied to this and other latches to put them in the correct initial state. The signal on output node 216 passes through inverter 218 to the input of NAND gate 220. The other input is the Poweron signal, so that transistor 255 is initially turned on. When node 32 first changes state (when bus 185 reaches voltage $V_M$) the signal from node 32 in pump 110B causes latch 215 to change state, turning transistors 210 and 255 off. Transistor 210 remains off during the remainder of the chip operation, preventing transistor 255 from connecting pump 110D to bus 185 during normal operation. During that normal operation, pump 110B maintains bus 185 at its design level. When bus 185 requires more current during normal operation FIG. 6 will be changed as follows: pump 110B will be replaced by pump 110C (i.e. set at $V_H$), node 256 will be connected to bus 190, node 258 will be connected to bus 185, inverter 222 will be connected to pass transistor 257 positioned between pump 110D and node 258, pass transistor 255 will be controlled as described below, and controller 130 will be switchable as described with respect to FIG. 3. When the voltage on bus 185 reaches $V_M$, bus 185 will be disconnected from pump 110D by transistor 257, controlled by the logic in the upper left corner of the Figure. Pump 110D will continue to drive bus 190, together with pump 110C. When bus 190 reaches $V_H$, pump 110D will be disconnected from bus 190 (by counterpart logic responsive to a signal from node 32 of pump 110C indicating that bus 190 has reached its design value) and reconnected to bus 185 by turning transistor 257 back on.

Those skilled in the art will appreciate that a switch that is open disconnects a circuit (forms an open circuit) and one that is closed forms, or opens, a path for current. Accordingly, in order to eliminate confusion, the following language will be used: when the pass transistors in FIGS. 4, 5, or 6 are on, a current path is established, and when they are off, there is a disconnection.

While the invention has been described in terms of a single preferred embodiment, those skilled in the art will recognize that the invention can be practiced in various versions within the spirit and scope of the following claims.

I claim:

1. A power circuit for supplying a set of at least two voltages to at least two power buses comprising:

a first power generation circuit, controlled by a corresponding controller circuit and connected to a first power bus, for generating current at a first one of said at least two voltages;

a second power generation circuit, controlled by a corresponding controller circuit and connected to a second power bus, for generating current at a second one of said at least two voltages;

at least one controllable power connection circuit connected between said second power generation circuit and two of said at least two power buses for establishing current paths between said power generation circuit and both of said power buses during an initial power ramp up period until a lower bus reaches the lower of said two voltages, at which time said power connection circuit disconnects a current path to said lower bus and said second power generation circuit drives a higher bus during a second power ramp up period lasting until said higher bus reaches the higher of said two voltages.

2. A circuit according to claim 1, in which;

said first power generation circuit maintains said first power bus at said lower voltage during normal operation;

said second power generation circuit maintains said second power bus at said higher voltage during normal operation; and said controllable power connection circuit comprises a controllable bus connection circuit for connecting two of said power buses together, whereby a current path is established from said second power generation circuit to said second bus and to said first bus during said initial power ramp up period.

3. A power generator circuit for supplying a set of at least two voltages to at least two power buses comprising:

a set of at least two power generation circuits connected to only one of said power buses, each of which is controlled by a corresponding voltage controller circuit for generating current at at least one of said at least two voltages;

at least one controllable shorting switch circuit connecting two of said power buses, whereby current flows between said two power buses when said shorting switch circuit is closed during an initial power ramp up period lasting until a lower one of said power buses reaches the lower of said two voltages, at which time said switch circuit opens and a higher one of said at least two power generation circuits drives a higher one of said power buses to a higher voltage level.

4. A power generator circuit for supplying a set of at least two voltages to at least two corresponding power buses comprising:

at least one power generation circuit, controlled by a corresponding voltage controller circuit, for generating current at a higher one of said at least two voltages and connected to a higher bus of said at least two power buses;

at least one controllable shorting switch circuit connecting two of said power buses, whereby current flows between said two power buses when said shorting switch circuit is closed during an initial power ramp up period lasting until a lower one of said power buses reaches the lower of said two voltages, at which time said switch circuit opens; and at least one controllable power connection circuit connected between a switchable power generation circuit and two of said corresponding power buses for establishing a current path between said power generation circuit and a higher bus during said initial power ramp up period and also during a second power ramp up period lasting until said higher bus reaches the higher of said two voltages, at which time said power connection circuit closes said current path to said higher bus and establishes a current path to said lower bus and said corresponding voltage controller circuit switches to maintain said lower bus at said lower of said two voltages.

* * * * *